United States Patent
Yagoobi

(10) Patent No.: US 12,324,128 B2
(45) Date of Patent: Jun. 3, 2025

(54) GRAVITY INDEPENDENT LIQUID COOLING FOR ELECTRONICS

(71) Applicant: Worester Polytechnic Institute, Worcester, MA (US)

(72) Inventor: Jamal S. Yagoobi, Hopkinton, MA (US)

(73) Assignee: Worcester Polytechnic Institute, Worcester, MA (US)

( * ) Notice: Subject to any disclaimer, the term of this patent is extended or adjusted under 35 U.S.C. 154(b) by 196 days.

(21) Appl. No.: 17/975,437

(22) Filed: Oct. 27, 2022

(65) Prior Publication Data

US 2023/0132688 A1 May 4, 2023

Related U.S. Application Data

(60) Provisional application No. 63/272,874, filed on Oct. 28, 2021.

(51) Int. Cl.
*H05K 7/20* (2006.01)
*H05K 1/02* (2006.01)

(52) U.S. Cl.
CPC ....... *H05K 7/20327* (2013.01); *H05K 1/0201* (2013.01); *H05K 7/2039* (2013.01); *H05K 2201/066* (2013.01)

(58) Field of Classification Search
CPC ... H05K 7/1488–1489; H05K 7/20154; H05K 7/2029; H05K 7/20236;
(Continued)

(56) References Cited

U.S. PATENT DOCUMENTS 6,352,838 B1* 3/2002 Krulevitch ........... C12N 15/101
435/34
6,383,555 B1 5/2002 Hayashi et al.
(Continued)

FOREIGN PATENT DOCUMENTS

KR 10-2020-0060716 A 6/2020
WO 2006079111 A2 7/2006
WO 2015145280 A1 10/2015

OTHER PUBLICATIONS

International Search Report, PCT/US2022/048087, Jul. 13, 2023, pp. 1-4.
(Continued)

*Primary Examiner* — Amir A Jalali
(74) *Attorney, Agent, or Firm* — Armis IP Law, LLC

(57) ABSTRACT

A combined electrohydrodynamic (EHD) and dielectrophoretic (DEP) cooling approach for a processor or similar electronics in a zero gravity environment is beneficial in space exploration. An EHD pumping mechanism is defined by an array of alternating, polarized electrodes surrounding a heat sink coupled to the processor for heat exchange, such as a thermally conductive layer or coating. The array may be circular, rectangular, or any suitable geometry, generally guided by a shape of the heat sink/processor. Cooling fluid is drawn or pumped towards the heat sink by EHD electrodes, and a dielectrophoretic (DEP) electrode disposed above the center of the heat sink extracts the generated vapor bubbles away from the heated surface with a diverging electrical field. One configuration calls for a radial arrangement of EHD electrodes drawing the cooling fluid towards a centrally located heat sink.

17 Claims, 4 Drawing Sheets

(58) Field of Classification Search
CPC ........... H05K 7/20254; H05K 7/20272; H05K 7/20309–20327; H05K 7/20509; H05K 7/20627–20645; H05K 7/20663; H05K 7/20681; H05K 7/2039; H05K 1/0201; H05K 1/0203–0204; H05K 1/0207; H05K 1/0209; H05K 1/181; H05K 2201/066

See application file for complete search history.

(56) References Cited

U.S. PATENT DOCUMENTS

| | | | |
|---|---|---|---|
| 7,486,000 B1* | 2/2009 | Hacsi | H02N 10/00 60/516 |
| 11,353,263 B2 | 6/2022 | Plavnik | |
| 2008/0101022 A1* | 5/2008 | Cernasov | H05K 7/20327 361/699 |
| 2009/0095630 A1* | 4/2009 | Liu | B03C 5/005 204/547 |
| 2009/0266516 A1* | 10/2009 | Jewell-Larsen | B05B 5/0255 165/84 |
| 2012/0276550 A1* | 11/2012 | Kuok | B01L 3/502761 435/7.1 |
| 2014/0092551 A1* | 4/2014 | Pearson | H05K 7/20327 361/699 |
| 2014/0202665 A1* | 7/2014 | Paschkewitz | H01L 23/427 165/104.26 |
| 2019/0107333 A1* | 4/2019 | Niu | F28D 15/02 |
| 2021/0202351 A1* | 7/2021 | McNamara | H01L 23/3737 |
| 2021/0276550 A1 | 9/2021 | Gotou et al. | |

OTHER PUBLICATIONS

Patel, Viral K., et al., "Effect of Gravity on Electrohydrodynamic Conduction Driven Liquid Film Flow Boiling," AIAA J. Thermophys. Heat Transfer, 30(2), pp. 429-437.

Patel, Viral K., et al., "Combined Dielectrophoretic and Electrohydrodynamic Conduction Pumping for Enhancement of Liquid Film Flow Boiling", Jun. 2017, vol. 139, pp. 061502-1-061502-9, Journal of Heat Transfer.

Patel, Viral K., et al., "Electrohydrodynamic Conduction Pumping Driven Liquid Film Flow Boiling on Bare and Nanofiber-Enhanced Surfaces," ASME J. Heat Transfer vol. 138, Apr. 2016, pp. 041501-1-041501-8.

Pearson, Matthew R., et al., "Experimental Study of Linear and Radial Two-Phase Heat Transport Devices Driven by Electrohydrodynamic Conduction Pumping," ASME J. Heat Transfer, Feb. 1, 2015, 137(2), pp. 022901-1-022901-9.

Yang, Mengquiao, et al., "A Numerical Study of Liquid-Vapor Interface in the Presence of Dielectrophoretic Force", Oct. 2019, pp. 1-6.

* cited by examiner

GRAVITY INDEPENDENT LIQUID COOLING FOR ELECTRONICS

RELATED APPLICATIONS

This patent application claims the benefit under 35 U.S.C. § 119 (e) of U.S. Provisional Patent App. No. 63/272,874, filed Oct. 28, 2021, entitled "GRAVITY INDEPENDENT LIQUID COOLING FOR ELECTRONICS," incorporated herein by reference in entirety.

STATEMENT OF FEDERALLY SPONSORED RESEARCH AND DEVELOPMENT

This patent application is based on research sponsored, in part, by the National Aeronautics and Space Administration under agreement number NNX16AT09G and 80NSSC18K1295. The Government has certain rights in the invention.

BACKGROUND

Modern electronic devices generate substantial heat due to a concentration of many electrical components in an integrated circuit of a relatively small size. As modern semiconductor technology improves to result in increasing circuit density, the number of heat-producing circuit elements occupy a smaller footprint. An electron flow through a circuit generates heat, and therefore an increase in circuit density produces a corresponding increase in the heat generated. Modern semiconductors, for example, require fluidic cooling, either by forced air fans, or by liquid based cooling, which is becoming more prevalent due to the increased heat transfer capabilities of liquid.

SUMMARY

A combined electrohydrodynamic (EHD) and dielectrophoretic (DEP) cooling approach for a processor or similar electronics in a zero gravity environment is beneficial in space exploration. An EHD pumping mechanism is defined by an array of alternating, polarized electrodes surrounding a heat sink coupled to the processor for heat exchange, such as a thermally conductive layer or coating. The array may be circular, rectangular, or any suitable geometry, generally guided by a shape of the heat sink/processor. Cooling fluid is drawn or pumped towards the heat sink by EHD electrodes, and a dielectrophoretic (DEP) electrode disposed above the center of the heat sink extracts the generated vapor bubbles away from the heated surface with a diverging electrical field. One configuration calls for a radial arrangement of EHD electrodes drawing the cooling fluid towards a centrally located heat sink. An alternate configuration may employ an EHD pumping surface having a linear arrangement of EHD electrodes for directing the cooling fluid towards an edge of the EHD pumping surface. Specifically, the dielectrophoretic (DEP) force/mechanism is used to remove the vapor bubbles, and in a zero gravity environment, overcomes the absence of gravity, thus making pool boiling feasible for transport and removal of gaseous bubbles.

Configurations herein are based, in part, on the observation that zero gravity environments, such as space vehicles, satellites and related equipment often employ substantial computing hardware. Unfortunately, conventional approaches suffer from the shortcoming that environmental controls such as HVAC systems and liquid cooling approaches operate differently in zero gravity environments and may have inconsistent power expectations where power efficiency is paramount. With conventional methods such as liquid phase cooling, the capability of removing heat in the absence of gravity at high heat flux levels diminishes. Thus, it is not a viable solution to rely on liquid cooling in the absence of gravity at high heat flux levels. In contrast to alternate approaches, where EHD pumped fluids are directed by gravitational forces to separate gaseous bubbles resulting from boiling, a zero gravity environment allows no such considerations. Accordingly, configurations herein present a system for cooling of electronics/computers at especially high heat flux levels in the absence of gravity with an electric field, thereby making pool boiling of cooling liquid feasible in space for cooling of electronics/computers. It should be further noted that the DEP generated forces need not be coupled with a heat flux/boiling arrangement in order to effect DEP forces, however.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Cooling of electronics, including computer boards, processors and integrated circuits in low or zero gravity space is a formidable challenge. This is especially true with powerful CPUs where cooling at high capacity is needed. Cooling in the presence of liquid/vapor phase change (such as pool boiling) provides cooling at high heat flux levels. Unfortunately, in the absence of gravity, bubbles generated due to phase change do not leave the heated surface. Thus, the effective cooling techniques, such as pool boiling, becomes impractical. Accordingly, there is a need for a technology that makes pool boiling practical in space by extracting the generated bubbles away from the heated surface (i.e. electronics).

Configurations herein differ from conventional approaches because the disclosed approach extracts the generated vapor bubbles away from the heated surface with a diverging electrical field. Specifically, the dielectrophoretic (DEP) force/mechanism is used to transport vapor bubbles away from the heat source. The presence of the DEP mechanism overcomes the absence of gravity, thus, making pool boiling feasible for fluid flow based heat transfer and cooling.

The description below presents an example of a fluidic transport system, including a set or array of electrohydrodynamic (EHD) electrodes adapted for disposing a fluid, and a dielectrophoretic (DEP) electrode in proximity to the EHD electrodes. The fluid is a cooling or working fluid in fluidic communication with both the EHD electrodes and DEP electrodes for cooperative transport of the working fluid for thermal transfer away from a heat sink or heat generating component, typically a microprocessor circuit in need of cooling.

Various configurations depicting the above features and benefits as disclosed herein are shown and described further below. In a basic configuration, the depictions below illustrate a fluidic transport system including a set of electrohydrodynamic (EHD) electrodes adapted for disposing a fluid, and a dielectrophoretic (DEP) electrode in proximity to the EHD electrodes and adapted to operate on the same fluidic mass. A working fluid is in fluidic communication with both the EHD electrodes and DEP electrodes for cooperative transport of the working fluid, and may be employed for any suitable transport of the working fluid in addition to the heat transfer example disclosed below.

Figure 1:
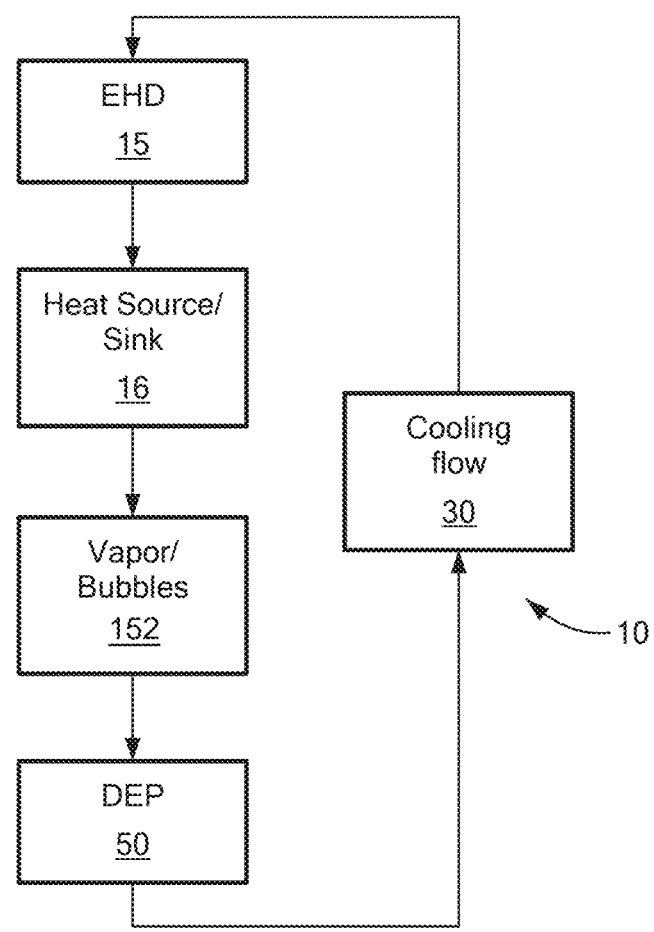
FIG. 1 is a schematic flow of combined EHD/DEP zero gravity liquid cooling for electronics as disclosed herein.

FIG. 1 is a schematic flow of combined EHD/DEP zero gravity liquid cooling for electronics as disclosed herein. In a zero gravity environment 10, a method for cooling electronic circuits includes combining an electrohydrodynamic (EHD) 15 and dielectrophoretic (DEP) 50 fluid transport mechanism in an absence of gravity. The method involves heating a working fluid 30 from a heat source or heat sink 16 thermally coupled to a circuit to be cooled, typically as a film or layer of liquid. As a result of heating, the DEP field imposes a force for disposing bubbles resulting from boiling of the cooling fluid for drawing heat from the heat sink 16 resulting in cooling of the circuit.

In operation, a flow of the working fluid 30 is generated towards the heat sink 16 resulting from forces generated from the EHD fluid transport mechanism. This may be in a circumferential, linear or open space arrangement. Once the fluid film, layer or flow is accumulated in thermal communication with the heat sink 16, and absorbs heat, boiling the fluid. A flow of the working fluid is generated away from the heat sink and between electrodes providing the DEP fluid transport mechanism. In a closed or recirculating vessel 120 (FIG. 2), this cycles the working fluid 30 back towards the heat sink in an iterative manner. Condensation of the working fluid may assist in returning gaseous bubbles to a liquid form for cycling the working fluid in an iterative thermal transfer.

A particular configuration forms the DEP electrode 50 opposed from the heat sink 16 for imparting dielectrophoretic movement to the bubbles in an absence of gravity induced liquid pressure. In a zero gravity environment, gaseous bubbles do not "rise" based on liquid pressure from gravity. The DEP electrode 50 generates a DEP field for transport of vapor bubbles of the working fluid in an absence of buoyancy from surrounding liquid (working fluid). By forming a EHD electrode 15 adjacent the heat sink, the EHD pumping mechanism is disposed for transporting the working fluid towards the heat sink 16 for boiling into vapor bubbles. In a cycling manner, this alternates the working fluid between a liquid phase and a gaseous phase between the EHD pumping mechanism and the DEP pumping mechanism for continued reheating and cooling of the working fluid for drawing heat off the heat sink.

In the example configurations herein EHD, the EHD phenomenon involves the interaction between flow fields and electric fields in a dielectric fluid medium. A general expression of the electric body force in EHD phenomena is given by the following equation:

$$f_e = \rho_e E - \frac{1}{2}E^2 \nabla \varepsilon + \frac{1}{2} \nabla \left[ E^2 \left( \frac{\partial \varepsilon}{\partial \rho} \right)_\gamma \rho \right]$$

The first term represents the Coulomb force which acts on free charges within the cooling fluid. The second and third terms represent the translational and distortional responses of polarized charges resulting from the imposed electric field and are known as the dielectrophoretic and electrostriction forces, respectively. EHD conduction pumping is primarily driven by the Coulomb force acting on free space charges which are redistributed to the vicinity of the electrodes. Free charges are formed due to the imbalance in the dissociation and recombination of neutral electrolytic species in the dielectric fluid. Proper asymmetric design of the electrodes generates net axial flow motion, pumping the fluid. EHD conduction pumps may therefore be employed as the sole driving mechanism for small-scale heat transport systems and have a simple electrode design, which allows them to be fabricated in exceedingly compact form (down to microscale). EHD conduction is also an effective technique to pump a thin liquid film.

In configurations herein, EHD conduction is combined with an additional mechanism from dielectrophoresis. Dielectrophoresis is a translational motion of neutral matter in a nonuniform electric field provided by the DEP conductors 160. The nonuniform electric field results in field induced polarization of vapor bubbles or particles in the fluid. Unlike the Coulomb force (which acts on free charges), the DEP force acts on the polarized charges and can be used to influence vapor bubble motion during nucleate boiling. The DEP force acting on a vapor bubble of radius a is given by:

$$F_{DEP} = 2\pi a^3 \varepsilon_1 \left( \frac{\varepsilon_2 - \varepsilon_1}{\varepsilon_2 + 2\varepsilon_1} \right) \nabla |E_e|^2$$

In the above equation, particles are repelled from regions of stronger electric fields if their permittivity is less than that of suspension medium, e2<e1. For an example configuration, the liquid medium is the working fluid hydrochlorofluorocarbon (HCFC)-123, although other working fluids responsive to the DEP and EHD forces may be employed, based on available voltage, circuit and ambient temperature ranges, and available volume in which the cooling cycle occurs. The resulting DEP force is proportional to the gradient of the electric field squared. A strong nonuniform electric field results in a DEP force acting on individual vapor bubbles.

Introduction of such a system in a zero gravity, artificial pressurized environment, such as space travel, results in particularly beneficial results. Variations in a selected working (cooling) fluid, heating/boiling/vapor pressure of the working fluid, electrode size/voltage and other physical and ambient parameters may be pertinent in a zero gravity configuration. A resulting design at the system level will consider the effects of these controlling parameters along w others on the design, operating conditions etc. of DEP electrode as well as EHD pumping (if needed).

Figure 2:
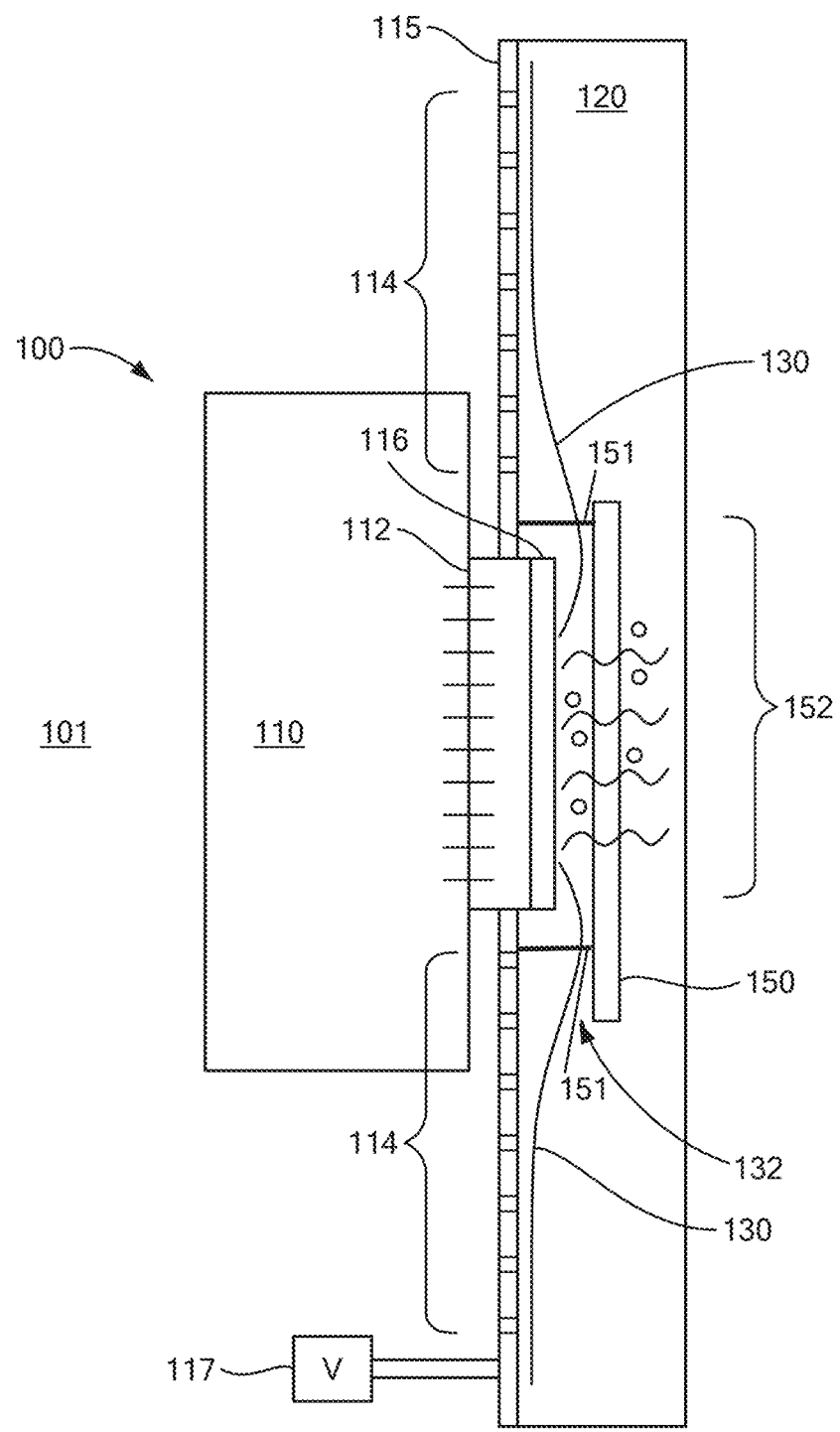
FIG. 2 shows a side view of an electrohydrodynamic cooling device as in FIG. 1.
Figure 3:
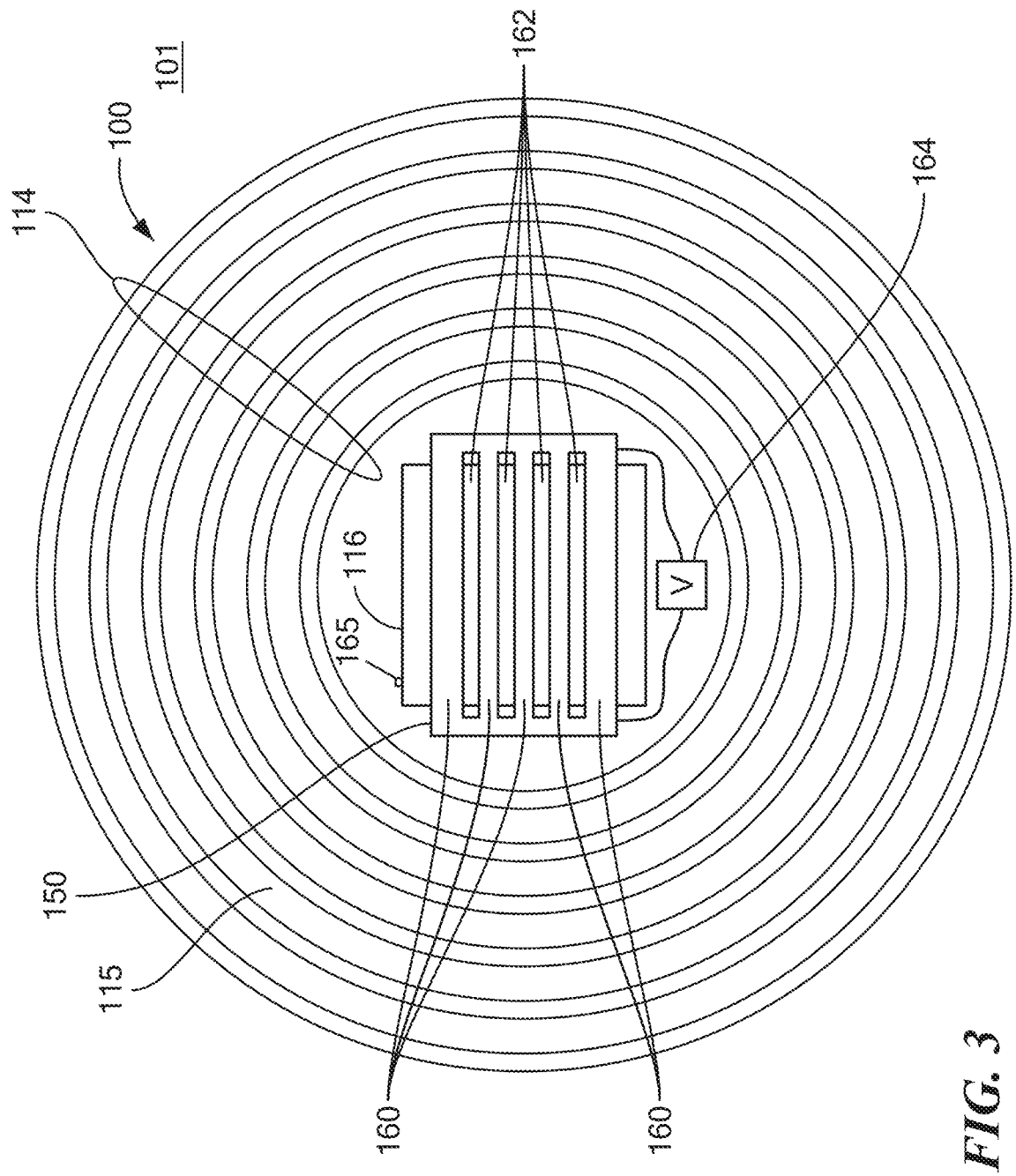
FIG. 3 shows a plan view of the device 100 of FIG. 1 illustrating the EHD pumping surface.

Referring to the views of FIGS. 1-3, FIG. 2 shows a side view of an electrohydrodynamic cooling device 100 including a heat sink 116 coupled to a processor 112 of an electronic circuit 110 in a zero-gravity environment 101. A cooling fluid 130 is in a fluidic coupling with the heat sink 116 for heat transfer. The heat sink 116 is simply a highly thermal conductive material and resistant to a cooling fluid 130, but may be omitted if the processor 112 is hermetically sealed and thermally consistent to operate in direct communication with the cooling fluid 130 in the vessel 120. An electrohydrodynamic (EHD) pumping surface 115 engages the heat sink 116 for transport of the cooling fluid 130, and a dielectrophoretic (DEP) electrode 150 is in communication with the heat sink 116 by an offset distance from support mechanism 151 for drawing vapor bubbles 152 in boiling cooling fluid away from the heat sink. The heat sink 116 defines a heat source, typically a layer or coating of thermally conductive material for facilitating heat transport. An aluminum or metal plate is often employed, and optionally may have fins for increased surface area. Alternatively, the processor or circuit element itself may define a heat source and the cooling fluid flowing directly over the processor.

FIG. 3 shows a plan view of the device 100 of FIG. 2 illustrating that the EHD pumping surface 115 defines a pumping region around the heat sink 116, such that the EHD pumping surface 115 directs the cooling fluid 130 towards the heat sink 116.

In the example arrangement, the heat sink 116 is disposed in a substantially centered position in the EHD pumping surface 115. The pumping surface 115 includes EHD electrodes 114 in the surface positioned to direct the cooling fluid 130 towards the heat sink 116. The EHD pumping surface 115 includes a plurality of concentric EHD electrodes 114 for directing the cooling fluid 130 towards a center of the EHD pumping surface 115, powered by a voltage source 117. A linear or sequential arrangement may also be used for defining a recirculating flow.

Figure 4:
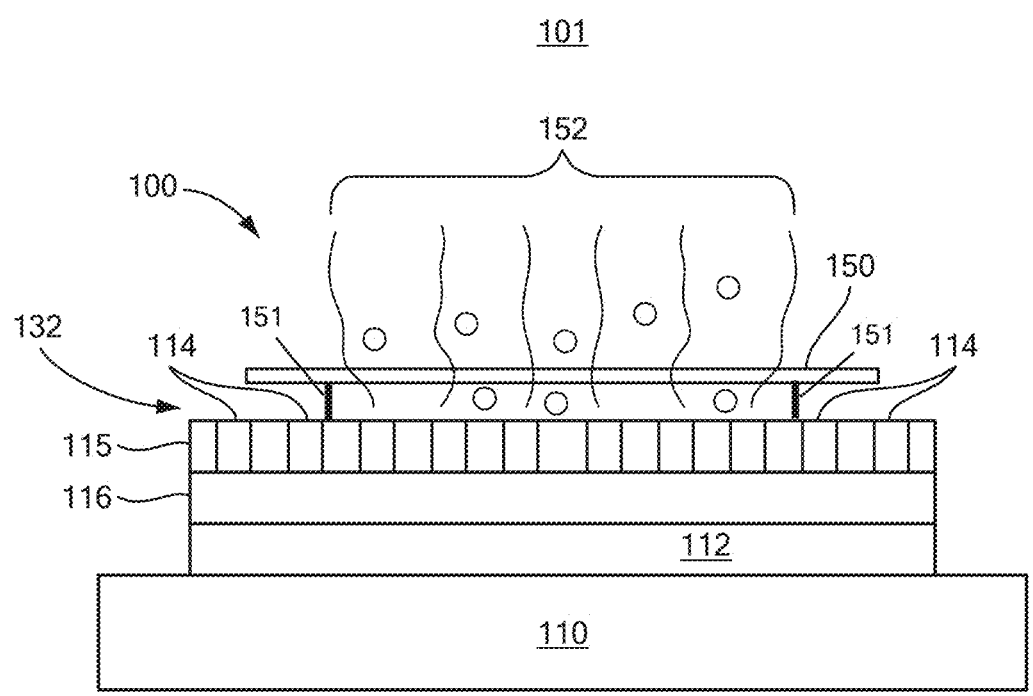
FIG. 4 shows an alternate cutaway view of the cooling device as in FIGS. 1-3.

FIG. 4 shows an alternate cutaway view of the cooling device as in FIGS. 1-3. Referring to FIG. 4, the EHD electrodes 114 may also extend completely over the processor 112/heat sink 116 assembly, defining a layered structure between the processor 112, heat sink 116, vapor region for accommodating bubbles 152 and DEP electrode 150 offset by a distance based on the bubble 152 flow. The DEP electrode 150 is disposed adjacent the heat sink 116 and separated by a pumping gap 132, such that the pumping gap is based on a type of the cooling fluid 130 and an aggregate volume of bubbles accumulated in a given time.

It is generally expected that the DEP electrode 150 has a planar shape and is disposed on a parallel plane from the EHD pumping surface 115 in the offset defined by the pumping gap 132, and powered by any suitable voltage source 164 and ground connection 165. The zero gravity environment 101 ensures that an orientation, such as the vertical arrangement of FIG. 1, is generally agnostic to fluid flow due to little or no gravitational influence based on the zero gravity environment.

Continuing to refer to FIG. 3, the DEP electrode 150 has a plurality of parallel conductors 160, each having a width and separated by a gap 162 from an adjacent parallel conductor, wherein each gap has a size based on a heat transfer coefficient. Voltage levels and electrode size may be configured based on desired heat and flow rate parameters.

While the system and methods defined herein have been particularly shown and described with references to embodiments thereof, it will be understood by those skilled in the art that various changes in form and details may be made therein without departing from the scope of the invention encompassed by the appended claims.

What is claimed is:

1. An electrohydrodynamic cooling device, comprising:
a heat sink coupled to an electronic circuit defining a heat source in a zero-gravity environment;
a cooling fluid in fluidic coupling with the heat sink for heat transfer; and
a dielectrophoretic (DEP) electrode in communication with the heat sink for drawing vapor bubbles in the boiling cooling fluid away from the heat sink.

2. The device of claim 1 further comprising an electrohydrodynamic (EHD) pumping surface engaging the heat sink for transport of the cooling fluid.

3. The device of claim 1 wherein the EHD pumping surface defines a pumping region around the heat sink, the EHD pumping surface directing the cooling fluid towards the heat sink.

4. The device of claim 3 wherein the heat sink is disposed in a centered position in the EHD pumping surface, further comprising EHD electrodes in the surface positioned to direct the cooling fluid towards the heat sink.

5. The device of claim 4 wherein the EHD pumping surface includes the plurality of concentric EHD electrodes for directing the cooling fluid towards the center of the EHD pumping surface.

6. The device of claim 4 wherein the EHD pumping surface includes a linear arrangement of the EHD electrodes for directing the cooling fluid towards an edge of the EHD pumping surface.

7. The device of claim 1 wherein the DEP electrode is disposed adjacent the heat sink and separated by a pumping gap, the pumping gap based on a type of the cooling fluid and an aggregate volume of the bubbles accumulated in a given time.

8. The device of claim 7 wherein the DEP electrode has a planar shape and is disposed on a parallel plane from the EHD pumping surface.

9. The device of claim 7 wherein the DEP electrode has a plurality of parallel conductors, each having a width and separated by the gap from an adjacent parallel conductor, the gap having a size based on a heat flux.

10. A fluidic transport system, comprising:
a set of electrohydrodynamic (EHD) electrodes adapted for disposing a working fluid;
a dielectrophoretic (DEP) electrode surrounded by the EHD electrodes; and
the working fluid in fluidic communication with both the EHD electrodes and the DEP electrode for cooperative transport of the working fluid.

11. A method for cooling electronic circuit, comprising:
combining an electrohydrodynamic (EHD) and dielectrophoretic (DEP) fluid transport mechanism in an absence of gravity;
heating a working fluid from a heat sink thermally coupled to a circuit to be cooled; and
disposing bubbles resulting from boiling of the cooling fluid for drawing heat from the heat sink resulting in cooling of the circuit.

12. The method of claim 11 further comprising:
generating a flow of the working fluid towards the heat sink resulting from forces generated from the EHD fluid transport mechanism;
generating a flow of the working fluid away from the heat sink and between a set of DEP electrodes providing the DEP fluid transport mechanism; and
cycling the working fluid back towards the heat sink in an iterative manner.

13. The method of claim 11 further comprising forming a DEP electrode opposed from the heat sink for imparting dielectrophoretic movement to the bubbles in an absence of gravity induced liquid pressure.

14. The method of claim 13 wherein the DEP electrode generates a DEP field for transport of the vapor bubbles of the working fluid in an absence of buoyancy from the surrounding liquid working fluid.

15. The method of claim 11 further comprising forming an EHD electrode adjacent the heat sink, an EHD pumping mechanism disposed for transporting the working fluid towards the heat sink for boiling into the vapor bubbles.

16. The method of claim 11 further comprising alternating the working fluid between a liquid phase and a gaseous phase between an EHD pumping mechanism and the DEP pumping mechanism in a cyclic manner.

17. A cooling apparatus for an electronic circuit, comprising:
- a dielectrophoretic (DEP) electrode including a conductive, planar material having a plurality of parallel portions, each portion defined by a gap between adjacent portions;
- a support mechanism for suspending the DEP electrode above a heat source of the electronic circuit, the support mechanism defining a gap between the DEP electrode and the heat source;
- a ground connection, the ground connection for coupling the DEP electrode in a non-contacting manner with the electronic circuit;
- a fluid medium responsive to the DEP electrode for heat absorption and transport from the electronic circuit;
- a voltage source coupled to the DEP electrode for resulting in a flow of the fluid medium for heat conduction and transport; and
- an enclosure for encapsulating the electronic circuit and the fluid medium.

* * * * *